(12) United States Patent
Zou

(10) Patent No.: US 11,307,642 B2
(45) Date of Patent: Apr. 19, 2022

(54) METHOD FOR MANAGING POWER SUPPLY STATE OF MEMORY AND CHIP

(71) Applicant: SHENZHEN GOODIX TECHNOLOGY CO., LTD., Shenzhen (CN)

(72) Inventor: Nan Zou, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/134,148

(22) Filed: Dec. 24, 2020

(65) Prior Publication Data
US 2021/0191502 A1    Jun. 24, 2021

Related U.S. Application Data

(63) Continuation of application No. PCT/CN2019/126407, filed on Dec. 18, 2019.

(51) Int. Cl.
*G06F 1/32* (2019.01)
*G06F 1/3287* (2019.01)
*G06F 1/3234* (2019.01)

(52) U.S. Cl.
CPC .......... *G06F 1/3287* (2013.01); *G06F 1/3275* (2013.01)

(58) Field of Classification Search
CPC ..... G06F 1/3287; G06F 1/3275; G11C 5/144; G11C 5/148; G11C 11/4074; G11C 2207/2227; G11C 2211/4067
See application file for complete search history.

(56) References Cited

U.S. PATENT DOCUMENTS

| | | | |
|---|---|---|---|
| 5,928,365 A * | 7/1999 | Yoshida | G06F 12/023 713/324 |
| 8,195,971 B2 | 6/2012 | Jiang | |
| 2002/0042250 A1 | 4/2002 | Tamukai | |
| 2010/0050007 A1 | 2/2010 | Jiang | |
| 2010/0185883 A1 * | 7/2010 | Hamilton | G06F 8/4432 713/320 |

FOREIGN PATENT DOCUMENTS

| | | |
|---|---|---|
| CN | 1347262 A | 5/2002 |
| CN | 101656098 A | 2/2010 |
| CN | 105760112 A | 7/2016 |
| CN | 108052293 A | 5/2018 |

\* cited by examiner

*Primary Examiner* — Stefan Stoynov

(57) ABSTRACT

Embodiments of this application disclose a method for managing a power supply state of a memory and a chip, where the memory includes a plurality of storage areas, and the plurality of storage areas are separately powered by an independent power supply. The method includes: determining an occupancy condition of the plurality of storage areas by a program according to allocation address information of a segment, in the program, to be stored in the plurality of storage areas; and configuring a power supply state of the plurality of storage areas according to the occupancy condition of the plurality of storage areas by the program.

18 Claims, 3 Drawing Sheets

Determining an occupancy condition of the plurality of storage areas by a program according to allocation address information of a segment, in the program, to be stored in plurality of storage areas — S410

Configuring a power supply state of the plurality of storage areas according to the occupancy condition of the plurality of storage areas by the program — S420

METHOD FOR MANAGING POWER SUPPLY STATE OF MEMORY AND CHIP

CROSS-REFERENCE TO RELATED APPLICATIONS

This application is a continuation of International Application No. PCT/CN2019/126407, filed on Dec. 18, 2019, the disclosure of which is hereby incorporated by reference in its entirety.

TECHNICAL FIELD

Embodiments of this application relate to the field of memories, and in particular, to a method for managing a power supply state of a memory and a chip.

BACKGROUND

Some memories may include a plurality of storage areas, and the plurality of storage areas have separate power supplies. When a storage area is not working, a power supply of the storage area may be turned off to reduce power consumption.

A memory can be used to store a program so that the program can run on the memory. However, when the program needs to be stored in the memory, how to control a power supply state of a plurality of storage areas becomes an urgent problem.

SUMMARY

Embodiments of this application provide a method for managing a power supply state of a memory and a chip, which can effectively control power supply to a plurality of storage areas.

According to a first aspect, a method for managing a power supply state of a memory is provided, where the memory includes a plurality of storage areas, the plurality of storage areas are separately powered by an independent power supply, and the method includes: determining an occupancy condition of the plurality of storage areas by a program according to allocation address information of a segment, in the program, to be stored in the plurality of storage areas; and configuring a power supply state of the plurality of storage areas according to the occupancy condition of the plurality of storage areas by the program.

The method can obtain the occupancy condition of the plurality of storage areas in the memory by the program through the allocation address information of the segment in the program, and further implement power supply control of the plurality of storage areas according to the occupancy condition of the memory by the program, so as to reduce power consumption. Compared with the manual configuration manner, this method can obtain distribution of a program dynamically. When the program is updated or changed, reconfiguration can be implemented without human intervention.

In some possible implementation manners, the allocation address information includes at least one of the following: a start address, a length, an end address, and an index of a storage area.

In some possible implementation manners, the segment of the program includes at least one of the following: a code segment, a zero ZI segment, a read/write RW segment, a read only RO segment, a stack space segment, and a heap space segment.

In some possible implementation manners, the method further includes: determining the segment, in the program, to be stored in the plurality of storage areas.

In some possible implementation manners, the method further includes: obtaining a link script file of the program; and obtaining the allocation address information of the segment according to the link script file.

During program compilation, a system assigns addresses to a plurality of segments of a program to obtain a link script file. This application utilizes this feature and obtains the allocation address information in the link script file by building a function in a compiler, so that an occupied condition of each storage area can be accurately known and optimal power configuration of the storage area can be implemented.

In some possible implementation manners, the configuring a power supply state of the plurality of storage areas according to the occupancy condition of the plurality of storage areas by the program includes: configuring an occupied storage area to a power-on mode; and/or configuring an unoccupied storage area to a power-off mode.

In some possible implementation manners, the memory is a static random access memory SRAM.

According to a second aspect, a chip is provided, including: a memory, including a plurality of storage areas, where the plurality of storage areas are separately powered by an independent power supply; and a processor, configured to: determine an occupancy condition of the plurality of storage areas by a program according to allocation address information of a segment, in the program, to be stored in the plurality of storage areas; and configure a power supply state of the plurality of storage areas according to the occupancy condition of the plurality of storage areas by the program.

The chip can obtain the occupancy condition of the plurality of storage areas in the memory by the program through the allocation address information of the segment in the program, and further implement power supply control of the plurality of storage areas according to the occupancy condition of the memory by the program, so as to reduce power consumption. Compared with the manual configuration manner, this chip can obtain distribution of a program dynamically. When the program is updated or changed, reconfiguration can be implemented without human intervention.

In some possible implementation manners, the allocation address information includes at least one of the following: a start address, a length, an end address, and an index of a storage area.

In some possible implementation manners, the segment of the program includes at least one of the following: a code segment, a zero ZI segment, a read/write RW segment, a read only RO segment, a stack space segment, and a heap space segment.

In some possible implementation manners, the processor is configured to determine the segment, in the program, to be stored in the plurality of storage areas.

In some possible implementation manners, the processor is configured to: obtain a link script file of the program; and obtain the allocation address information of the segment according to the link script file.

During program compilation, a system assigns addresses to a plurality of segments of a program to obtain a link script file. This application utilizes this feature and obtains the allocation address information in the link script file by building a function in a compiler, so that an occupied condition of each storage area can be accurately known and optimal power configuration of the storage area can be implemented.

In some possible implementation manners, the processor is configured to: configure an occupied storage area to a power-on mode; and/or configure an unoccupied storage area to a power-off mode.

In some possible implementation manners, the memory is a static random access memory SRAM.

DESCRIPTION OF EMBODIMENTS

Figure 1:
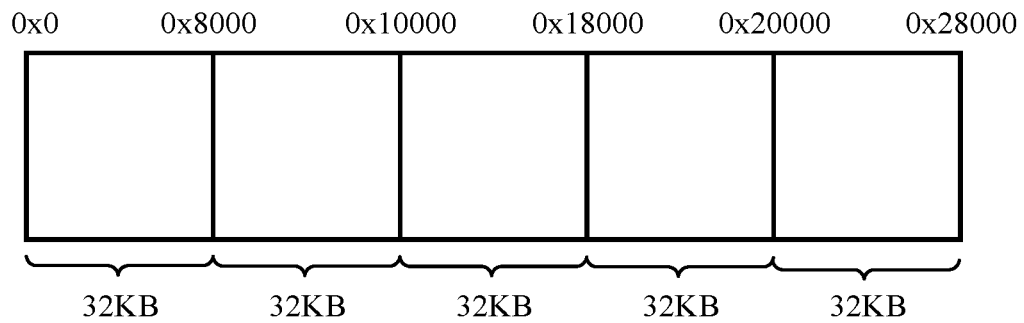
FIG. 1 is a layout of a plurality of storage areas included in a memory according to an embodiment of this application.

Technical solutions in this application will be described hereinafter with reference to the accompanying drawings.

In design and development of a low-power product, global system power consumption is often optimized. A major strategy is to turn off power supply of unused devices as much as possible. In this way, overall system power consumption can be reduced to the greatest extent, making battery power supply reach a maximum endurance capability.

The foregoing devices may be, for example, memories. Some memories may include a plurality of storage areas, and each of the plurality of storage areas has a separate power manager. When a corresponding storage area is set to a power-off mode, that is, a power supply is controlled not to supply power to the storage area, a read/write operation cannot be performed in the storage area, and data in the storage area will also be lost. Therefore, if there is no data to be stored in the storage area, the storage area may not be powered to reduce power consumption.

The memory may be configured to store a program. A program can include a plurality of segments, and different segments represent different contents. The memory can be configured to store data of at least one segment in a program. For example, the memory may be configured to store a variable or partial code in a program.

Not all storage areas are used when a program is stored in the memory. For a smaller program, only a portion of the storage area may be needed for storing the program, while the remaining storage area is idle. In this embodiment of this application, only a storage area in which data needs to be stored needs to be set to a power-on mode, and a storage area in which data does not need to be stored needs to be set to a power-off mode, so as to achieve a power-saving mode.

When a size of the program itself changes, for example, when a system program is updated, a layout of a storage space of the program in the memory is generally affected. For example, a storage area in which data originally does not need to be stored needs for storing data after the program is updated; or a storage area in which data originally needs to be stored does not need for storing data after the program is updated. In this way, after the program is updated, a power supply state of each storage area may change. Therefore, how to dynamically determine the power supply state of each storage area becomes an urgent problem.

At present, a conventional manner is to determine the power supply state of each storage area through manual estimation. For example, a designer often turns off the power supply of an unused storage area by default in a program. In this case, the designer needs to estimate a size or scale of the program in advance and then pre-configure a storage area according to the size and scale of the program. In this way, the power supply state of each storage area has been set before the program runs.

When the size of the program changes, for example, when a system program is updated, the designer needs to perform evaluation and setting again, that is, re-estimate a size of the updated program and then re-configure the storage area according to the size of the updated program. This manual estimation manner requires human intervention to implement reconfiguration when the program is updated or changed, and a configuration method is relatively cumbersome.

In addition, since the size of the program is estimated artificially, the estimated size of the program is not accurate enough, which easily leads to waste of system electric energy or an error of program operation. For example, some storage areas actually do not need to store data, but a result of manual estimation is that these storage areas need to store data. As a result, although these storage areas are not unused, power continues to be supplied, causing waste of electric energy. For another example, some storage areas actually need to store data, but a result of manual estimation is that these storage areas do not need to store data. As a result, power is not supplied for these storage areas, and the program cannot run in these storage areas, resulting in an error of program operation.

A configuration process of a memory is described in detail below in combination with FIG. 1 to FIG. 3.

A static random-access memory (SRAM) is used as an example. The SRAM may include a plurality of storage areas, and each storage area has an independent power supply. It is assumed that a specification of the SRAM is shown in FIG. 1. The SRAM may include five storage areas, where each storage area is 32 KB in length, that is, each storage area may be used to store 32 KB data. Each storage area may be powered by a separate power manager, and each storage area may be independently controlled to be in a power-on mode (FULL POWER) or a power-off mode. The power-on mode indicates that a power supply of a storage area supplies power to the storage area, and the storage area can be used for storing data and performing normal read and write operations. The power-off mode indicates that a power supply of a storage area does not supply power to the storage area, and thus the storage area cannot be used for storing data or performing read and write operations.

Certainly, the storage area may also include another mode, such as a retention mode, which is not specifically limited in this application. This application focuses on the power-on mode and power-off mode of the storage area.

Figure 2:
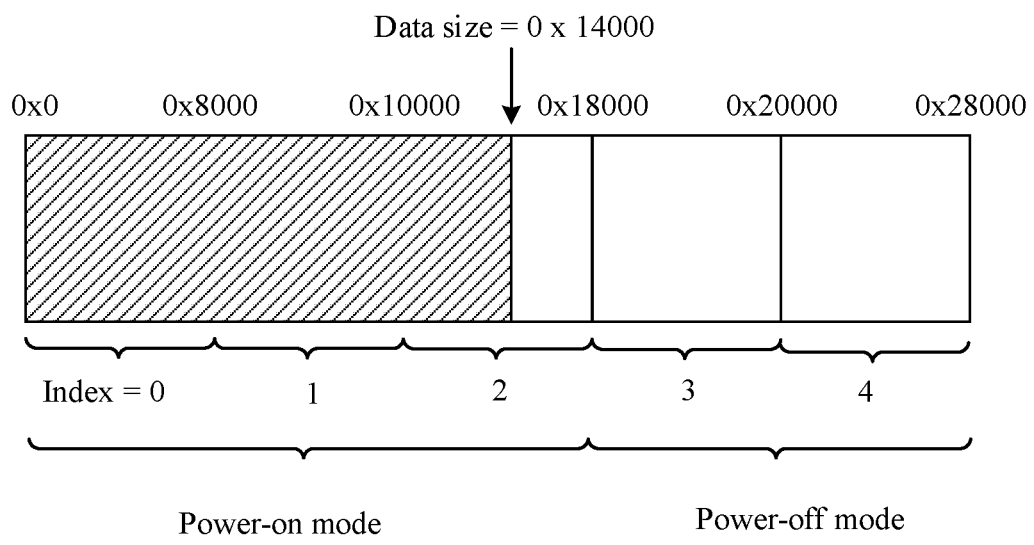
FIG. 2 is a schematic diagram showing configuration of a power supply state of a plurality of storage areas according to an embodiment of this application.
Figure 3:
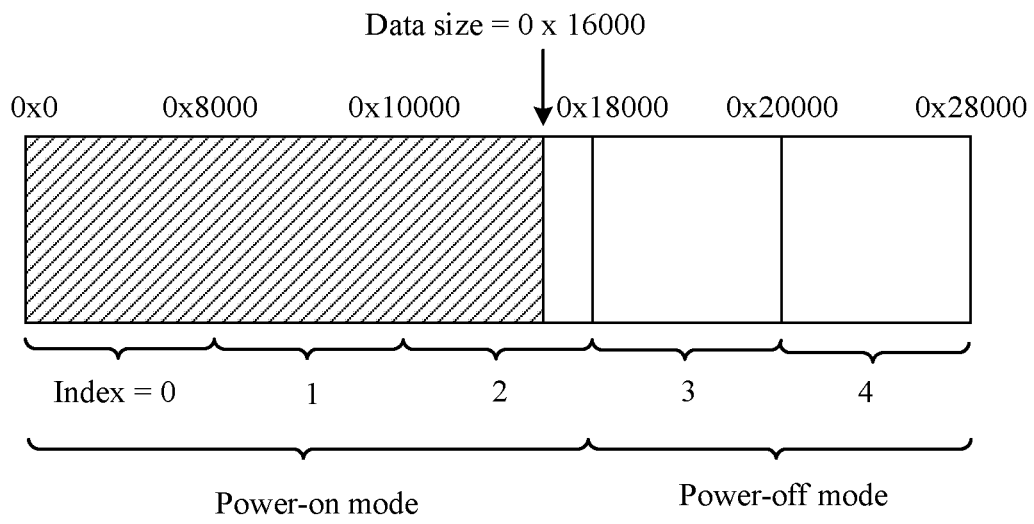
FIG. 3 is a schematic diagram showing configuration of a power supply state of a plurality of storage areas after a size of a program changes on the basis of FIG. 2.

When the memory needs to store a program, referring to FIG. 2, the slash area indicates a part of the SRAM occupied by the program, and the remaining area indicates an unoccupied part of the SRAM. Generally, if a size of the program is 0x14000, an optimal power consumption optimization strategy is to set storage areas whose indexes are 0, 1, and 2 to the power-on mode, and then set the storage areas whose indexes are 3 and 4 to the power-off mode.

When the size of the program changes, a designer needs to recalibrate data size, evaluate a latest SRAM occupancy condition, and then adjust the setting as appropriate. As shown in FIG. 3, when the data size changes to 0x16000, there is no difference in configuration from before because the data size does not exceed the area of index 2. However, every time the program changes, the designer needs to perform evaluation again, the process is not only cumbersome, but also prone to problems.

An embodiment of this application provide a method for managing a power supply state of a memory, so that the power supply state of the memory can be determined without human intervention, and a usage situation of each storage area can be accurately calculated, which is beneficial to saving electric energy of a system. The memory may include a plurality of storage areas, and the plurality of storage areas are separately powered by an independent power supply.

Figure 4:
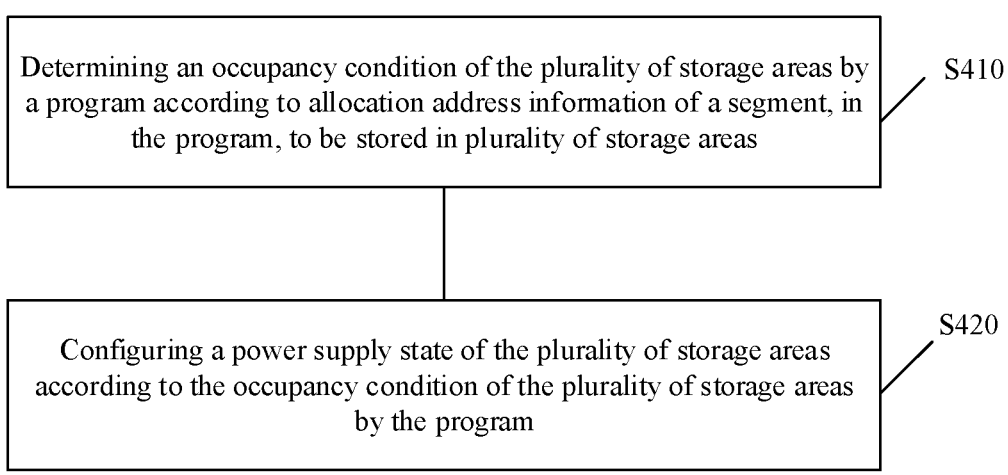
FIG. 4 is a schematic flow chart of a method for managing a power supply state of a memory according to an embodiment of this application.

As shown in FIG. 4, the method includes steps S410 and S420:

S410, determining an occupancy condition of the plurality of storage areas by a program according to allocation address information of a segment, in the program, to be stored in plurality of storage areas; and S420, configuring a power supply state of the plurality of storage areas according to the occupancy condition of the plurality of storage areas by the program.

The method can obtain the occupancy condition of the plurality of storage areas in the memory by the program through the allocation address information of the segment in the program, and further implement power supply control of the plurality of storage areas according to the occupancy condition of the memory by the program, so as to reduce power consumption. Compared with the manual configuration manner, this method can obtain distribution of the program dynamically. When the program is updated or changed, reconfiguration can be implemented without human intervention.

In this embodiment of this application, when the power supply state of the plurality of storage areas is configured, a power supply of an occupied storage area may be turned on, so that the storage area is in a working state. A power supply corresponding to an unoccupied storage area may be turned off, so that the storage area does not work, so as to reduce power consumption.

The segments in the program can be divided according to natures of data, and data of a same nature is grouped into a same segment. When a program is stored or run, different segments appear to be in different states. For example, a program may include two segments. A first segment represents a constant, and a second segment represents a variable. For another example, a program may include three segments. A first segment represents an instruction and a constant in the program, a second segment represents an initialized variable in the program, and a third segment represents an uninitialized variable in the program. For another example, a program may include four segments. A first segment represents execution code of the program, a second segment represents an initialized variable in the program, a third segment represents an uninitialized variable in the program, and a fourth segment represents an instruction and a constant in the program. A division form of the segments in the program is not particularly limited in the embodiment of this application.

As an implementation manner, the program may include at least one of a code segment, a read/write (RW) segment, a zero (ZI) segment, a read only (RO) segment, a stack space (CALLSTACK), and a heap space. The CODE segment represents an execution code of the program, and the CODE segment may further include some read-only constant variables, such as string constants. The RW segment represents an initialized variable in the program, the ZI segment represents an uninitialized variable in the program, and the RO segment represents an instruction and a constant in the program.

The segment of the program in this embodiment of this application may also be referred to as a domain of the program, an area of the program, or the like, which is not specifically limited in this application.

Different segments in a program may have different storage locations in a memory, for example, for a memory that includes a plurality of storage areas, different segments in the program may be stored in different storage areas in the memory. For another example, different segments in the program may alternatively be stored in different storage locations in a same storage area in the memory, which is not specifically limited in this application.

In this embodiment of this application, the power supply state of the plurality of storage areas may be controlled according to allocation address information of different segments in the memory, that is, only a power supply of a storage area in which data needs to be stored may be turned on, and a power supply of a storage area in which data does not need to be stored may be turned off, thereby reducing system overheads. In addition, in this embodiment of this application, when a program is updated or changed, a power supply state of a storage area can be dynamically determined without manual intervention, so that an operation manner is simple.

In addition, the manual configuration manner generally cannot be accurately calculated, which results in that power supplies of some storage areas without needing to store data are still turned on, resulting in a waste of system electric energy. The power supply state of the plurality of storage areas in this embodiment of this application is determined according to storage locations of different segments in the memory. A condition in which each storage area is occupied can be accurately determined, so that each storage area can be accurately managed, and a power supply corresponding to each storage area can be controlled to be turned on or off, thereby avoiding a waste of electric energy.

Allocation address information of a segment can be any information that represents an occupancy condition of each storage area. For example, the allocation address information may include a start address of the segment in the memory, a length of storage, an end address of the segment in the memory, and/or an index of a storage area in which the segment is located.

Both the start address and the end address can be used to indicate index information of the storage area in which the segment is located. For example, the start address and the end address of the segment can be used to indicate a specific storage area of the memory that the segment is stored and a specific location that the storage area is located.

The following description takes the program including a segment a as an example. Certainly, the program may alternatively include more segments, and a determination manner of other segments is similar to that of the segment a.

If the allocation address information includes information about the start address, and a start address of the segment a belongs to an address of a storage area 1, it indicates that data of the segment a is definitely required to be stored in the storage area 1, and a power supply corresponding to the storage area 1 can be turned on, so that the storage area 1 is in a power-on mode.

If the allocation address information includes information about the start address and the length of storage, a storage space occupied by the segment a as a whole in the memory can be determined based on a start address and a length of the segment a, so that specific storage areas whose power supply need to be turned on can be determined. If the storage space in which the segment a is located belongs to the storage area 1, the power supply corresponding to the storage area 1 needs to be turned on. If the storage space in which the segment a is located spans both the storage area 1 and a storage area 2, that is, both the storage area 1 and the storage area 2 require to store data of the segment a, it indicates that power supplies corresponding to both the storage area 1 and the storage area 2 need to be turned on.

If the allocation address information includes information about the end address and an end address of the segment a belongs to an address of a storage area 3, it indicates that data of the segment a is definitely required to be stored in the storage area 3, and a power supply corresponding to the storage area 3 can be turned on.

If the allocation address information includes information about the end address and the length of storage, a storage space occupied by the segment a as a whole in the memory can be determined according to an end address and the length of the segment a, so that specific storage areas whose power supply need to be turned on can be determined. If the storage space in which the segment a is located belongs to the storage area 3, the power supply corresponding to the storage area 3 needs to be turned on. If the storage space in which the segment a is located spans both the storage area 3 and a storage area 4, that is, both the storage area 3 and the storage area 4 require to store data of the segment a, it indicates that power supplies corresponding to both the storage area 3 and the storage area 4 need to be turned on.

If the allocation address information includes the index of the storage area, a power supply of a corresponding storage area can be turned on directly according to the index of the storage area. For example, if an index of a storage area occupied by the segment a is 5, it indicates that a power supply corresponding to the storage area 5 needs to be turned on. If indexes of a storage area occupied by the segment a are 5 and 6, it indicates that power supplies corresponding to the storage area 5 and the storage area 6 need to be turned on. This method requires only a small amount of resources to determine an occupancy condition of a plurality of storage areas by the program, which is beneficial to saving resources.

If different segments are stored adjacent to each other in the memory, and start addresses for storing the different segments are fixed, length information of a plurality of segments may be summarized only according to the length information of the plurality of segments, to determine an occupancy condition of the memory by the plurality of segments.

It can be understood that if a program includes a plurality of segments, an occupancy condition of the memory by each segment can be determined according to the method described above. After occupancy conditions of the memory by the plurality of segments are summarized and algorithm processing is performed, a specific occupancy condition of the memory by the program is finally obtained, so as to determine a power supply state of each storage area.

Sometimes not all segments in a program need to be stored in the memory in this embodiment of this application. In this embodiment of this application, only a segment that needs to be stored in the memory is considered. Therefore, in this embodiment of this application, before occupancy conditions of a plurality of storage areas by a plurality of segments are determined, whether the plurality of segments are stored or run in the memory may be determined.

It is assumed that the program includes three segments, a first segment is stored in a memory 1, a second segment and a third segment are stored in a memory 2, and only the memory 2 belongs to the memory mentioned in this embodiment of this application in which a plurality of storage areas can be controlled by independent power supplies. Therefore, only an occupancy condition of the memory 2 by the program is considered. In calculation, only allocation address information of the second segment and the third segment may be summarized to obtain the occupancy condition of the memory 2. In this case, allocation address information of the first segment may not be considered.

There are a plurality of manners of obtaining allocation address information of a segment to be stored in a plurality of storage areas, which is not specifically limited in this embodiment of this application.

For example, in the process of compiling a program, a system allocates addresses to a plurality of segments in the program. This application can use this feature in the process of compiling the program to obtain allocation address information of the plurality of segments in the program by building a function in a compiler, so that an occupancy condition of each storage area can be learned. By using allocation address information of a segment, an occupancy condition of a storage area can be calculated accurately, so that a power supply state of the storage area can be controlled accurately, so as to save power.

Optionally, in this embodiment of this application, allocation address information of a segment in the program in a storage area may be obtained according to a link script file generated in the process of compiling the program.

A program written by a programmer cannot be run directly on a computer. Therefore, before the program runs on the computer, the system needs to compile the program and convert the written program into machine code, and then the converted machine code can run on the computer.

General program compilation is divided into four stages: pre-compilation, compilation, assembly and link.

In a pre-compilation process, a pre-compilation instruction in a source file that starts with "#", such as "#include", or "#define", is mainly handled.

In a compiling process, a series of lexical analysis, syntax analysis, and semantic analysis as well as optimization are performed on a pre-compiled file to generate a corresponding assembly code file.

In an assembly process, assembly code is converted into a machine executable instruction, and each assembly statement corresponds to almost one machine instruction.

A purpose of the first three stages is to convert a written program to machine code according to language and syntax.

In a link process, several target binary files are linked together. The link process includes a process of allocating an address to a segment according to its characteristic.

A link script file may be obtained through the link process. Since the link script file includes allocation address information of different segments, in this embodiment of this application, the allocation address information of different segments may be obtained according to the link script file.

In this embodiment of this application, the allocation address information of each segment may be dynamically obtained based on a link script technology, and then evaluated dynamically by the program itself, and finally a power management configuration of a SRAM is completed.

A typical link script is as follows:

```
LR_FLASH APP_CODE_RUN_ADDR FLASH_SIZE
{
  FLASH_CODE APP_CODE_RUN_ADDR APP_MAX_CODE_
  SIZE {
      .ANY (+RO)
  }
  RAM_RW (RAM_START_ADDR + ROM_RTN_RAM_SIZE)
APP_RAM_SIZE {
      .ANY(+RW)
  }
  RAM_ZI +0 APP_RAM_SIZE {
      .ANY(+ZI)
  }
  ; define call-stack space
    ARM_LIB_STACKHEAP     AlignExpr(STACK_END_ADDR,
ALIGN_DWORD) EMPTY-CSTACK_HEAP_SIZE { }
}
```

Each of the foregoing instructions may include information such as a segment type, a stored memory type, a stored storage address, and/or a length (size). The storage address may include a start address and/or an end address. The foregoing link script file is described by using the start address as an example.

A program typically includes a CODE segment, an RW segment, a ZI segment, and an RO segment. Certainly, the program may further include another stack space and heap space segment. As can be seen from the foregoing link script file, the link script file shows specific memories the different segments are stored in, for example, a flash memory or a random-access memory (RAM). In the foregoing link script file, the CODE segment is stored in FLASH and the RW and ZI segments are stored in RAM. In addition, the link script file further shows the storage address and length of the program in memory and the like.

Since FLASH does not belong to a memory that separately uses an independent power supply to control a plurality of storage areas, only an occupancy condition of RAM is considered in this embodiment of this application.

In this embodiment of this application, a function may be built in a compiler during program compilation or after program compilation. The function is used to extract each segment and its corresponding allocation address information, for example, extract a type of a segment and corresponding allocation address information. Finally, the address information of each segment is summarized and algorithm processing is performed, and then a specific occupancy condition of the memory can be learned. The algorithm of this process is simple and occupation of its own resources can be ignored.

A program usually includes a plurality of segments, but not all segments are stored in a memory. In this embodiment of this application, only a case in which a memory has a plurality of storage areas and the plurality of storage areas have independent power supplies is considered.

A type of the memory is not specifically limited in this embodiment of this application. The memory may be any memory having a plurality of storage areas, such as an SRAM having a plurality of storage areas or an SRAM having other different physical media.

That the memory is an SRAM is used as an example. Although a program basically includes a CODE segment, an RW segment, a ZI segment and an RO segment, these four segments are not all stored in the SRAM. If the CODE segment and the RO segment are based on the execute in place (XIP) technology and stored in a FLASH and only the RW segment and the ZI segment are stored in the SRAM, only allocation address information of the RW segment and the ZI segment is considered in this embodiment of this application, and allocation address information of the CODE segment and the RO segment is not concerned.

Since a link script file is generated before the program runs, when the program changes, a new link script file is generated automatically. As long as a new link script file is generated, the allocation address information of different segments is obtained automatically in this embodiment of this application, so that allocation address information of each segment can be obtained dynamically without manual operation. In addition, the obtained allocation address information is more accurate than manual estimation, so that a power supply state of each storage area can be controlled more accurately and a more accurate power management configuration can be obtained.

Figure 5:
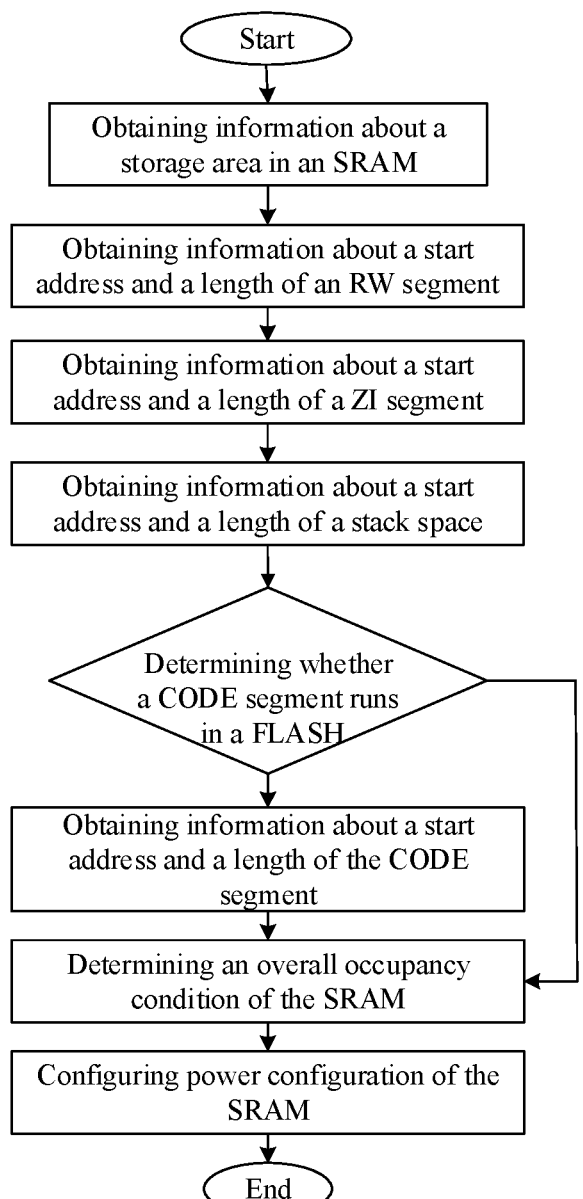
FIG. 5 is a schematic flow chart of another method for managing a power supply state of a memory according to an embodiment of this application.

The following describes a specific implementation process of this embodiment of this application by using an SRAM as an example and with reference to the procedure shown in FIG. 5.

Information about a plurality of storage areas in the SRAM is obtained. It is assumed that an RW segment, a ZI segment and a stack space are stored in the SRAM by default in a system. Therefore, start addresses and lengths of the RW segment, the ZI segment and the stack space can be obtained directly from a link script file. However, a CODE segment may run in a FLASH or the SRAM, whether the CODE segment runs in the FLASH may be first determined based on the link script file. If the CODE segment runs in the FLASH, an occupancy condition of the SRAM by the RW segment, the ZI segment and the stack space can be calculated. If the CODE segment does not run in the FLASH, but runs in the SRAM, an occupancy condition of the SRAM by the RW segment, the ZI segment, the stack space, and the CODE segment can be calculated. Further, a power supply condition of each storage area in the SRAM can be determined according to the occupancy condition of the SRAM by each segment.

Figure 6:
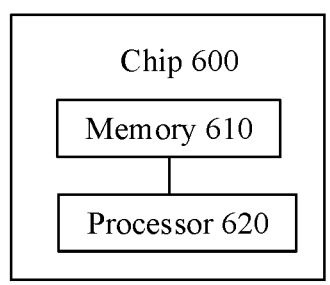
FIG. 6 is a schematic block diagram of a chip according to an embodiment of this application.

FIG. 6 is a schematic block diagram of a chip according to an embodiment of this application. The chip 600 includes a memory 610 and a processor 620. The memory 610 may be any memory described above, and the memory may be configured to perform any one of the methods described above.

The memory 610 includes a plurality of storage areas, and the plurality of storage areas are separately powered by an independent power supply.

The processor 620 is configured to: determine an occupancy condition of the plurality of storage areas by a program according to allocation address information of a segment, in the program, to be stored in the plurality of storage areas; and configure a power supply state of the plurality of storage areas according to the occupancy condition of the plurality of storage areas by the program.

Optionally, the allocation address information includes at least one of the following: a start address, a length, an end address, and an index of a storage area.

Optionally, the segment of the program includes at least one of the following: a code segment, a zero ZI segment, a read/write RW segment, a read only RO segment, a stack space segment, and a heap space segment.

Optionally, the processor is configured to determine the segment, in the program, to be stored in the plurality of storage areas.

Optionally, the processor is configured to: obtain a link script file of the program; and obtain the allocation address information of the segment according to the link script file.

Optionally, the processor is configured to: configure an occupied storage area to a power-on mode; and/or configure an unoccupied storage area to a power-off mode.

Optionally, the memory is a static random access memory SRAM.

It should be noted that terms used in embodiments of the present application and the claims appended hereto are merely for the purpose of describing particular embodiments, and are not intended to limit the embodiments of the present application.

For example, the use of a singular form of "a", "said", "the above" and "the" in the embodiments of the present application and the claims appended hereto are also intended to include a plural form, unless otherwise clearly indicated herein by context.

Those skilled in the art may be aware that, units and algorithm steps of the examples described in the embodiments disclosed in this paper may be implemented by electronic hardware, computer software, or a combination of the two. Whether these functions are executed in hardware or software mode depends on a particular application and a design constraint condition of the technical solutions. Persons skilled in the art may use different methods to implement the described functions for every particular application, but it should not be considered that such implementation goes beyond the scope of the embodiments of the present application.

If the integrated unit is implemented in the form of the software functional unit and is sold or used as an independent product, it may be stored in a computer readable storage medium. Based on such understanding, the technical solutions of the embodiments of the present application substantially, or the part of the present disclosure making contribution to the prior art, or a part of the technical solutions may be embodied in the form of a software product, and the computer software product is stored in a storage medium, which includes multiple instructions enabling computer equipment (which may be a personal computer, a server, network equipment or the like) to execute all of or part of the steps in the methods of the embodiments of the present application. The foregoing storage medium includes any medium that can store program code, such as a USB flash drive, a removable hard disk, a read-only memory, a random access memory, a magnetic disk, or an optical disc.

The above contents are merely specific implementation manners of the embodiments of this application, but the protection scope of the embodiments of this application is not limited thereto. Any variation or replacement readily figured out by a person skilled in the art within the technical scope disclosed in the embodiments of this application shall fall within the protection scope of the embodiments of this application. Therefore, the protection scope of the embodiments of this application shall be subject to the protection scope of the claims.

What is claimed is:

1. A method for managing a power supply state of a memory, wherein the memory comprises a plurality of storage areas, the plurality of storage areas are separately powered by an independent power supply, and the method comprises:
   determining an occupancy condition of the plurality of storage areas by a program according to allocation address information of a segment, in the program, to be stored in the plurality of storage areas; and
   configuring a power supply state of the plurality of storage areas according to the occupancy condition of the plurality of storage areas by the program;
   wherein the method further comprises:
   obtaining a link script file of the program; and
   obtaining the allocation address information of the segment according to the link script file.

2. The method according to claim 1, wherein the allocation address information comprises at least one of the following: a start address, a length, an end address, and an index of a storage area.

3. The method according to claim 2, wherein the segment comprises a segment a, and
   when the allocation address information includes information about the start address, and a start address of the segment a belongs to an address of a storage area 1, a power supply corresponding to the storage area 1 can be turned on, so that the storage area 1 is in a power-on mode; or
   when the allocation address information includes information about the start address and the length of storage, a storage space occupied by the segment a as a whole in the memory can be determined based on a start address and a length of the segment a, so that specific storage areas whose power supply need to be turned on can be determined; or
   when the allocation address information includes information about the end address and an end address of the segment a belongs to an address of a storage area 2, a power supply corresponding to the storage area 2 can be turned on; or
   when the allocation address information includes information about the end address and the length of storage, a storage space occupied by the segment a as a whole in the memory can be determined according to an end address and the length of the segment a, so that specific storage areas whose power supply need to be turned on can be determined; or
   when the allocation address information includes the index of the storage area, a power supply of a corresponding storage area can be turned on directly according to the index of the storage area.

4. The method according to claim 1, wherein the segment of the program comprises at least one of the following: a code segment, a zero (ZI) segment, a read/write (RW) segment, a read only (RO) segment, a stack space segment, and a heap space segment.

5. The method according to claim 1, wherein the method further comprises:
   determining the segment, in the program, to be stored in the plurality of storage areas.

6. The method according to claim 1, wherein the link script file be obtained through the link process.

7. The method according to claim 1, wherein the configuring a power supply state of the plurality of storage areas according to the occupancy condition of the plurality of storage areas by the program comprises:
   configuring an occupied storage area to a power-on mode; and/or, configuring an unoccupied storage area to a power-off mode.

8. The method according to claim 7, wherein before occupancy conditions of a plurality of storage areas by a plurality of segments are determined, whether the plurality of segments are stored or run in the memory is determined.

9. The method according to claim 1, wherein the memory is a static random access memory (SRAM).

10. A chip, comprising:
a memory, comprising a plurality of storage areas, wherein the plurality of storage areas are separately powered by an independent power supply; and
a processor, configured to: determine an occupancy condition of the plurality of storage areas by a program according to allocation address information of a segment, in the program, to be stored in the plurality of storage areas; and configure a power supply state of the plurality of storage areas according to the occupancy condition of the plurality of storage areas by the program;
wherein the processor is configured to: obtain a link script file of the program; and obtain the allocation address information of the segment according to the link script file.

11. The chip according to claim 10, wherein the allocation address information comprises at least one of the following: a start address, a length, an end address, and an index of a storage area.

12. The chip according to claim 11, wherein the segment comprises a segment a, and
when the allocation address information includes information about the start address, and a start address of the segment a belongs to an address of a storage area 1, a power supply corresponding to the storage area 1 can be turned on, so that the storage area 1 is in a power-on mode; or
when the allocation address information includes information about the start address and the length of storage, a storage space occupied by the segment a as a whole in the memory can be determined based on a start address and a length of the segment a, so that specific storage areas whose power supply need to be turned on can be determined; or
when the allocation address information includes information about the end address and an end address of the segment a belongs to an address of a storage area 2, a power supply corresponding to the storage area 2 can be turned on; or
when the allocation address information includes information about the end address and the length of storage, a storage space occupied by the segment a as a whole in the memory can be determined according to an end address and the length of the segment a, so that specific storage areas whose power supply need to be turned on can be determined; or
when the allocation address information includes the index of the storage area, a power supply of a corresponding storage area can be turned on directly according to the index of the storage area.

13. The chip according to claim 10, wherein the segment of the program comprises at least one of the following: a code segment, a zero (ZI) segment, a read/write (RW) segment, a read only (RO) segment, a stack space segment, and a heap space segment.

14. The chip according to claim 10, wherein the processor is configured to determine the segment, in the program, to be stored in the plurality of storage areas.

15. The chip according to claim 10, wherein the link script file be obtained through the link process.

16. The chip according to claim 10, wherein the processor is configured to: configure an occupied storage area to a power-on mode; and/or configure an unoccupied storage area to a power-off mode.

17. The chip according to claim 16, wherein before occupancy conditions of a plurality of storage areas by a plurality of segments are determined, whether the plurality of segments are stored or run in the memory is determined.

18. The chip according to claim 10, wherein the memory is a static random access memory (SRAM).

* * * * *